United States Patent
Patel et al.

(12) 
(10) Patent No.: US 6,373,126 B1
(45) Date of Patent: Apr. 16, 2002

(54) METHOD FOR REDUCING IC PACKAGE DELAMINATION BY USE OF INTERNAL BAFFLES

(75) Inventors: Pramod Patel, San Jose; Richard C. Blish, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/560,253

(22) Filed: Apr. 26, 2000

(51) Int. Cl.$^7$ .............................................. H01L 23/495
(52) U.S. Cl. ........................ 257/666; 257/676; 438/123
(58) Field of Search ................................. 257/666, 670, 257/676; 438/111, 123

(56) References Cited

U.S. PATENT DOCUMENTS

| | | | | |
|---|---|---|---|---|
| 3,585,455 A | * | 6/1971 | Naylor et al. | |
| 4,589,010 A | * | 5/1986 | Tateno et al. | |
| 5,162,895 A | * | 11/1992 | Takahashi et al. | |
| 5,485,037 A | * | 1/1996 | Marrs | |
| 5,714,792 A | * | 2/1998 | Przano | |
| 5,889,318 A | * | 3/1999 | Corisis | |
| 5,903,048 A | * | 5/1999 | Bandou et al. | |

* cited by examiner

Primary Examiner—Sheila V. Clark
(74) Attorney, Agent, or Firm—Paul J. Winters

(57) ABSTRACT

Barrier structures are included within the packaging material of a packaged semiconductor device, such barrier structures including barrier bodies which overlie the die-die pad assembly of the device on either side thereof. The barrier bodies act as baffles which limit diffusion of moisture through the packaging material into the area of the die-die pad assembly of the device, the barrier bodies including apertures therethrough which control such diffusion in a manner that avoids delamination problems in the area of the die-die pad assembly, meanwhile also avoiding undesirable trapping of gas within the packaging material.

17 Claims, 7 Drawing Sheets

METHOD FOR REDUCING IC PACKAGE DELAMINATION BY USE OF INTERNAL BAFFLES

BACKGROUND OF THE INVENTION

1. Field of the Invention

This invention relates generally to semiconductor packaging, and more particularly, to a package of a semiconductor device having increased ability to limit moisture flow through the packaging material and into the area of the die and die pad

2. Discussion of the Related Art

Reference is made to FIGS. 1–3, wherein a typical packaged semiconductor structure 10 is shown. As is well known, a die pad 12 has a die 14 epoxied thereon and tie bars 16, 18 extending therefrom. Bonding wires 20 connect the die 14 to the inner ends of leads 22. The die pad 12, die 14, wire bonding 20 and inner ends of the leads 22 are packaged in epoxy 24, commonly referred to as plastic packaging, with the outer ends of the leads 22 extending from the epoxy 24. These leads 22 may be plugged into a printed circuit board 26, as shown in FIG. 3.

Over a period of time, moisture 28 diffuses through the plastic package 24 and into the area of the die 14, die pad 12, and wire bonding 20. Through the operation of the device 10, heat buildup can cause moisture in those critical areas to vaporize, creating large amounts of steam pressure in pockets adjacent to these critical areas. In the case of moisture near the lower side of the die pad 12, blisters may form of sufficiently large size to cause connection problems between the printed circuit board 26 and the device 10. In the case of moisture near the upper side of the die 14, wire bond failure, die face damage, and/or die fracture can occur. Obviously, situations where such delaminations can occur are highly undesirable and can result in severe reliability problems.

Current practice is to measure how well each packaged device performs under JEDEC stress testing (specified temperature and humidity environment for a specified time for each Level). Manufacturers of semiconductor devices strive to reach Level 1 as that is the only level for which neither device baking nor a hermetic bagging are required. This "bake and bag" process involves additional expense, and would not be necessary if the package were inherently resistant to moisture flow therethrough to the area of the die 14, die pad 12 and wire bonding 20.

FIG. 4 shows a packaged semiconductor device 29 which utilizes an anodized aluminum heat spreader 30 in contact with the die pad 32 for dissipation of heat buildup during the operation of the device 29. In the fabrication of the device 29, the heat spreader 30 is placed in the well of a transfer molding machine, legs 34 extending from the heat spreader 30 contacting the bottom of the well, and a lead frame 36 having a die 38 associated therewith and wire bonded thereto is placed over the heat spreader 30 with the die pad 32 in contact with the heat spreader 30, so as to be an interference fit with the heat spreader 30. As molding compound 40 is forced into the area of the die 38 and die pad 32, air can be trapped above the heat spreader 30 and beneath the die pad 32 to form an air void therebetween. The heat spreader 30 includes apertures 42 therethrough to allow this air void to pass through the apertures 42 and away from the area of the die pad 32, thereby relieving pressure from this area. While this configuration is effective for this purpose, the problem of limiting moisture ingress into the area of the die pad 32, die 38, and wire bonding is not addressed. Indeed, the apertures 42 in the heat spreader 30 will readily allow moisture therethrough directly into the area of the die pad 32 in contact with the heat spreader 30. Furthermore, the problem of moisture ingress into the area of the die 38 and wire bonding through the packaging material thereabove is not addressed.

Therefore, it would be highly desirable to provide a system for limiting moisture diffusion through the plastic packaging material to the critical areas of the die, die pad, and wire bonding, so that the delamination problems described above are avoided.

SUMMARY OF THE INVENTION

In the present invention, in the environment of a semiconductor die epoxied to a die pad, with tie bars extending from the die pad, barrier structures are secured to the tie bars so as to have barrier bodies positioned on opposite sides of and overlying the die-die pad assembly. Each barrier body is spaced from the die-die pad assembly, and has a plurality of small apertures therethrough. As moisture diffuses through the plastic package material, the barrier bodies act as baffles to limit such diffusion in the direction of the die-die pad assembly to only that passing through the apertures. From these apertures the moisture diffuses in a spreading manner. Additional barrier structures may be provided which have barrier bodies overlying the above-described barrier bodies, the additional barrier bodies having apertures therethrough which are non-aligned with the apertures of the first-described barrier bodies to provide an even longer moisture flow path to the die-die pad area.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
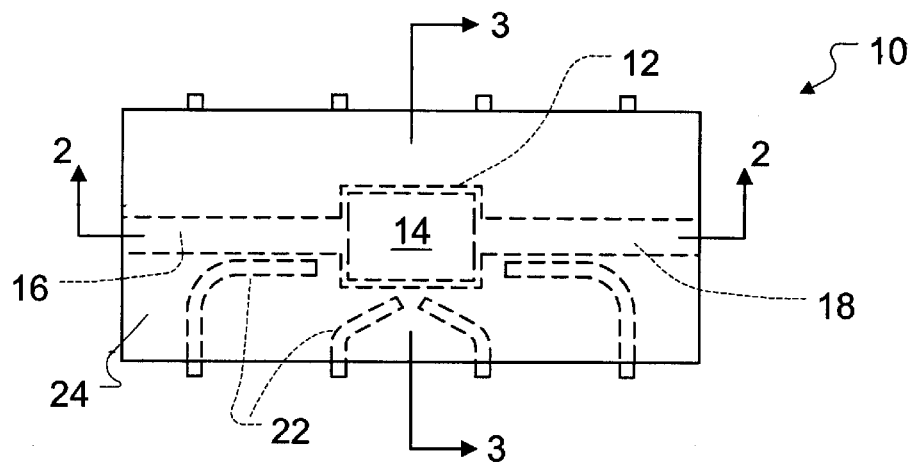
FIGS. 1–4 are sectional views of prior art semiconductor devices as described above.
Figure 2:
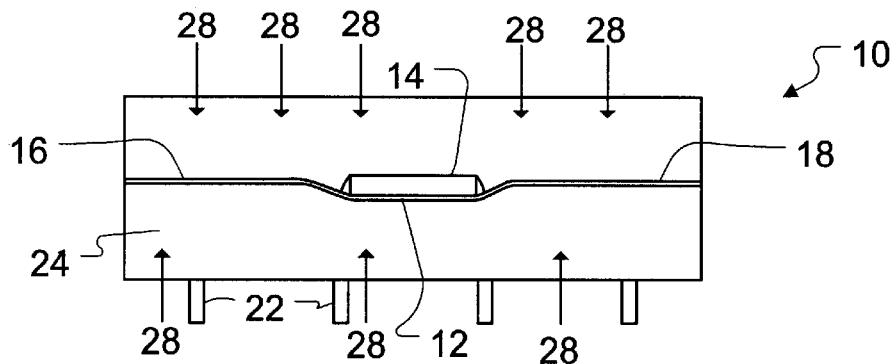
Figure 3:
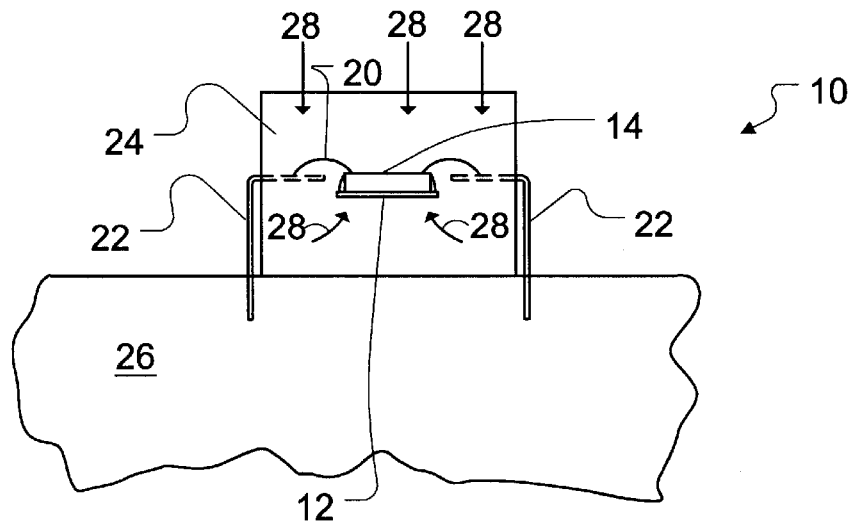
Figure 4:
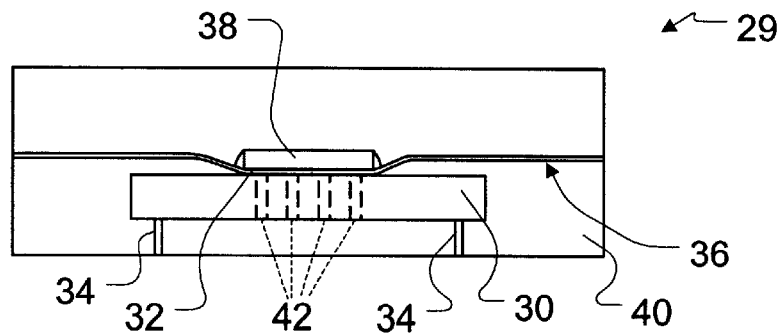
Figure 5:
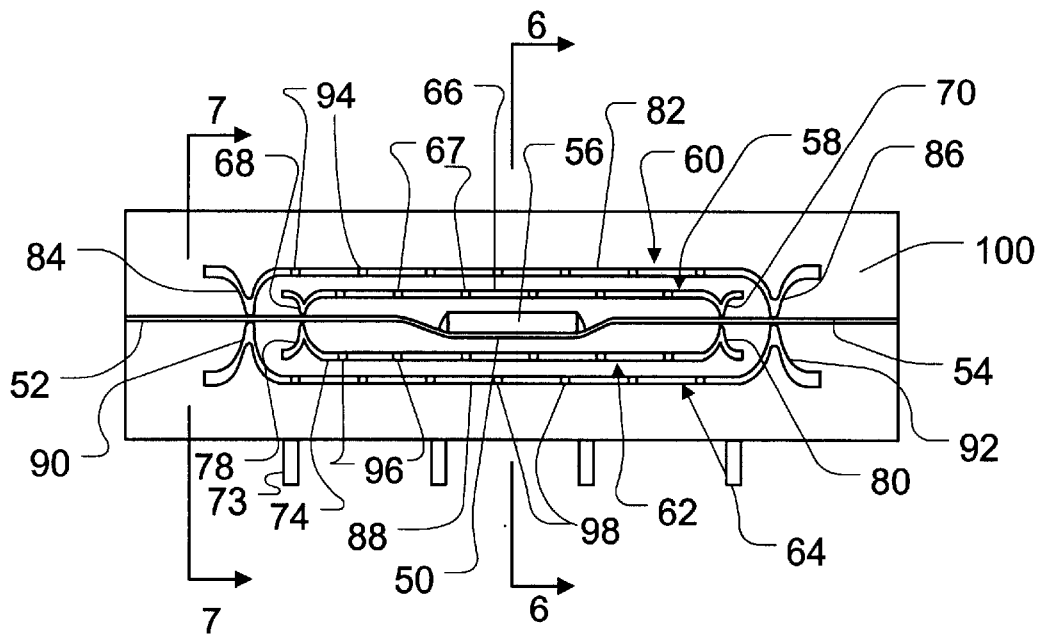
FIG. 5 is a sectional view of a semiconductor device incorporating the present invention.
Figure 6:
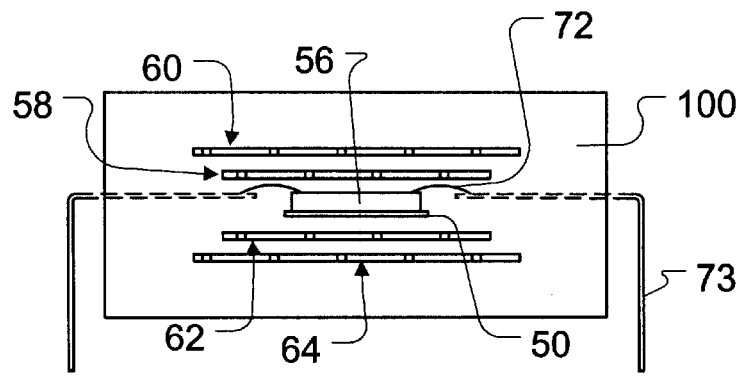
FIG. 6 is a sectional view of the device of FIG. 5, taken along the line 6—6 of FIG. 5.
Figure 7:
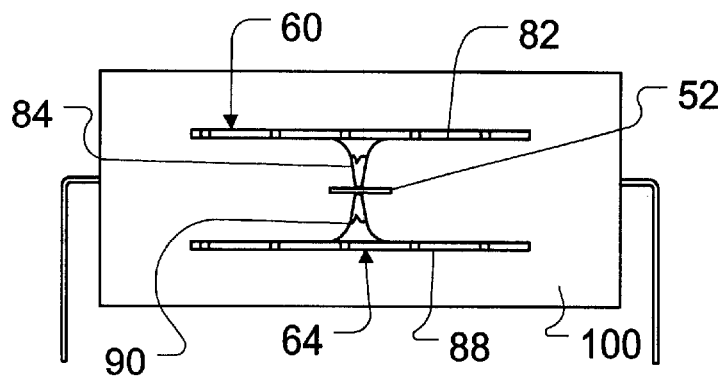
FIG. 7 is a sectional view of the device of FIG. 5, taken along the line 7—7 of FIG. 5.
Figure 8:
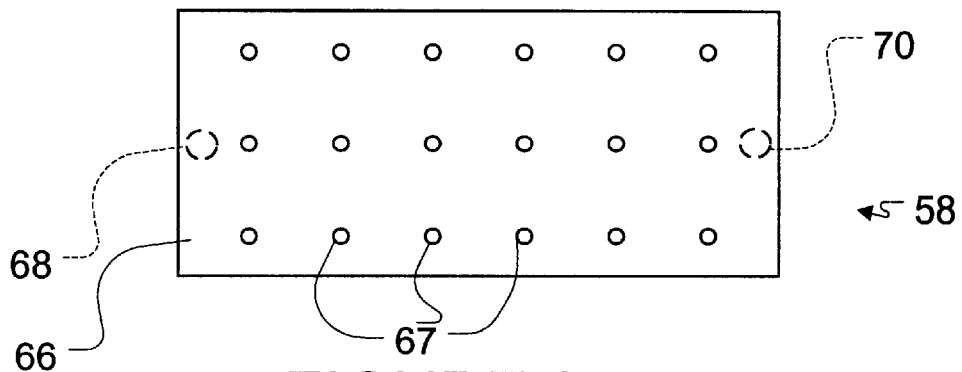
FIG. 8 is a plan view of a preferred embodiment of barrier structure of the present invention.
Figure 9:
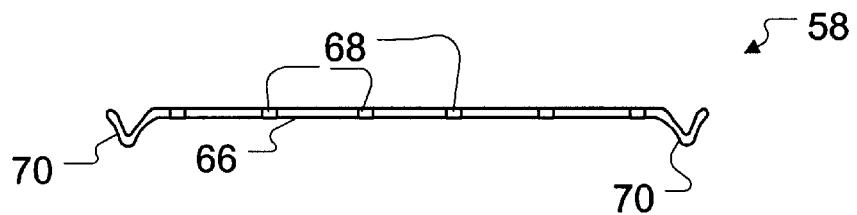
FIG. 9 is a side view of the barrier structure of FIG. 8.

As shown in FIGS. 5, 6 and 7, a die pad 50 has tie bars 52, 54 extending therefrom, and has epoxied thereon a silicon chip or die 56. The embodiment of FIGS. 5–7 includes barrier structures 58, 60, 62, 64, one of which is shown in detail in FIGS. 8 and 9. The barrier structure 58 is of very thin material, for example, Cu(Be) foil, and includes a rectangular barrier body 66 defining a plurality of apertures 67 therethrough and protrusions 68, 70 extending therefrom. The barrier structure 58 may be formed by a stamping process to define the rectangular overall configuration and to punch the plurality of apertures 67 through the barrier body 66, and also to form the protrusions 68, 70 extending from the barrier body 66. The barrier structure 58 may alternatively be fabricated of, for example, Alloy 42 (42 % Ni+58 % Fe), or copper alloy.

Again with reference to FIGS. 5–7, the barrier body 66 of the barrier structure 58 is positioned on the die side of the die 56—die pad 50 assembly, with the protrusions 68, 70 of the barrier structure 58 being secured to the tie bars 52, 54 by welding or glue. In such state, the barrier body 66 generally overlies and is spaced from the die 56—die pad 50 assembly, so as to be spaced from the die 56 and wire bonding 72, which connects the die 56 to leads 73. The barrier body 74 of the barrier structure 62 (similar in configuration to barrier structure 58) is positioned on the die pad side of the die 58—die pad 50 assembly, with the protrusions 78, 80 of the barrier structure 62 likewise being secured to the tie bars 52, 54 by welding or glue. The barrier body 74 generally overlies and is spaced from the die 56—die pad 50 assembly, so as to be spaced from the die pad 50. Additional barrier structure 60 overlies the barrier structure 58, and is spaced therefrom with the barrier body 66 of the barrier structure 58 positioned between the barrier body 82 of the barrier structure 60 and the die 58—die pad 50 assembly. This barrier structure 60 includes protrusions 84, 86 which are longer than the protrusions 68, 70 of the barrier structure 58, and is dimension so that the protrusions 84, 86 lie outward of the ends of the barrier structure 58. These protrusions 84, 86 of the barrier structure 60 are also welded or glued to the tie bars 52, 54. A similar structure 64 is provided on the die pad 50 side of the die 58—die pad 50 assembly. That is, additional barrier structure 64 has its body 88 overlying and spaced from the body 74 of the barrier structure 62, and has protrusions 90, 92 secured to the tie bars 52, 54.

Figure 10:
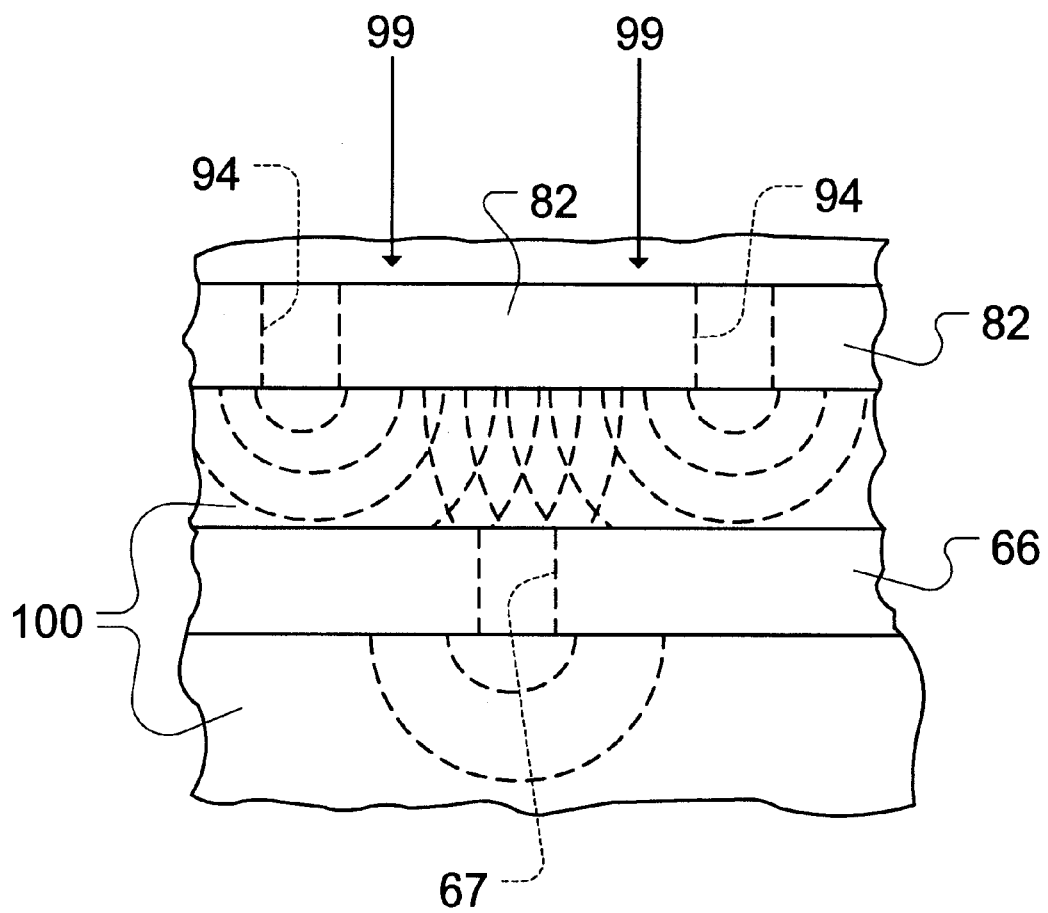
FIG. 10 is an enlarged view of a portion of the structure of FIG. 5, showing the barrier structures limiting moisture flow.

As will be seen from Figures, the apertures 67 in the barrier body 66 are non-aligned with the apertures 94 in the barrier body 82, i.e., they are in staggered relationship. Similarly, the apertures 96 in the barrier body 74 are non-aligned with the apertures 98 in the barrier body 88. As shown in FIG. 10, as moisture 99 flows through the packaging material 100 and toward the barrier body 82, this moisture 99 is blocked to a substantial extent by the barrier body 82 from passing into the area between the barrier bodies 82, 66. However, the moisture 99 which does pass through the apertures 94 of the barrier body 82, it will be seen, diffuses downwardly and outwardly as shown. Thus, a very limited amount of moisture passes through the apertures 94 of the barrier body 82, from which it is spread and diffused. It is only this very limited amount of moisture which may reach the barrier body 66. Thus, a very minimal amount of moisture will pass through the aperture 67 of the barrier body 66 and toward the die 58—die pad 50 assembly.

The barrier structures 62, 64 on the underside of the die 58—die pad 50 assembly clearly limit moisture flow to that area in the same manner.

The spacing of the barrier bodies from the die 58—die pad 50 assembly and from each other is significant in achieving the proper limitation of moisture flow into the critical areas. This spacing between elements allows the moisture to diffuse into relatively large areas so as to aid in the protection of critical structures.

While not essential, it is preferable that the barrier bodies not be continuous, but include such apertures shown and described Providing such apertures avoids the possible problem of molding compound intruding during transfer molding to trap bubbles of gas, creating voids. If such voids were present, local tensile stresses could increase and thermal impedance could be degraded. The apertures provided in the barrier bodies avoid such a potential problem by allowing such air to be vented away from the critical areas of the die, die and wire bonding.

The apertures in the barrier body may be spaced more widely in the least critical areas, those adjacent the junction of the die-die pad assembly, i.e., near the center of the barrier body, so that venting would move progressively inward from the periphery due to molding compound ingression. The effect is to provide the greatest limitation to moisture flow where the need is greatest, where the differential CTE (Coefficient of Thermal Expansion) is greatest, far from the die center.

The apertures in each barrier body may for example be 0.2 mm in diameter with a pitch of 1 mm.

Figure 11:
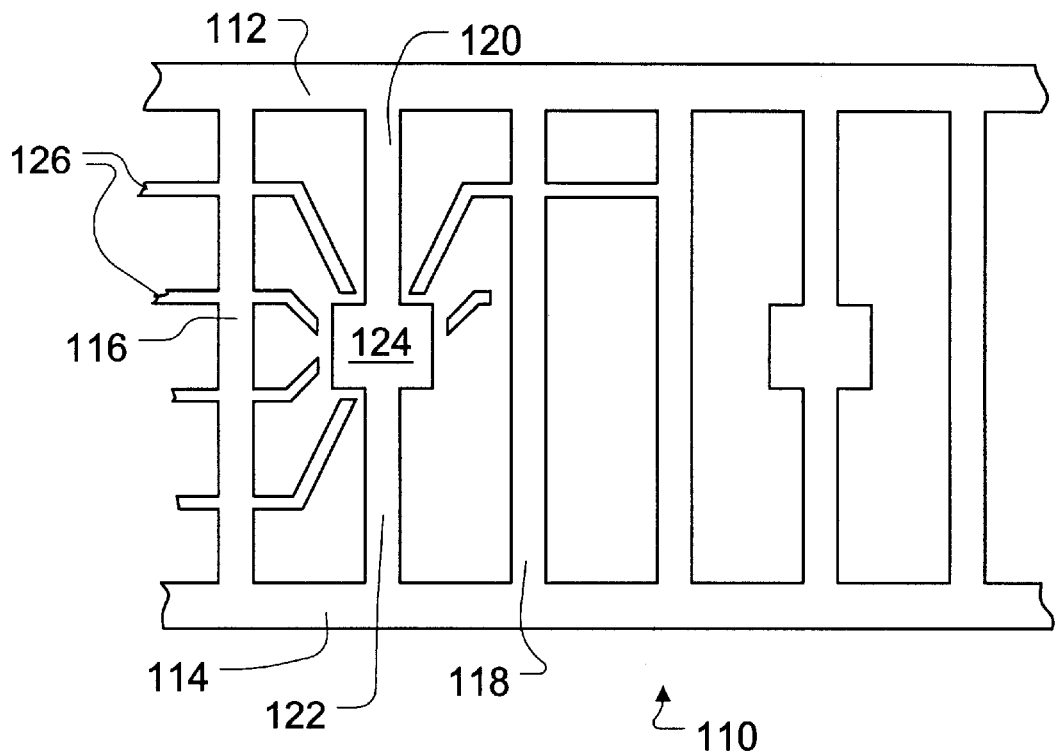
FIG. 11 it is a plan view of a typical lead frame for use in with the present invention.

In furtherance of describing the assembly of a semiconductor device incorporating the present invention, with reference to FIG. 11, a typical lead frame 110 is shown therein. As is well-known, a pair of rails 112, 114 are connected by dam bars 116, 118, with tie bars 120, 122 extending outward from a die pad 124 between a pair of dam bars 116, 118, the tie bars 120, 122 being connected to the rails 112, 114. Leads 126 are connected to the dam bars 116, 118 as is also well-known.

Figure 12:
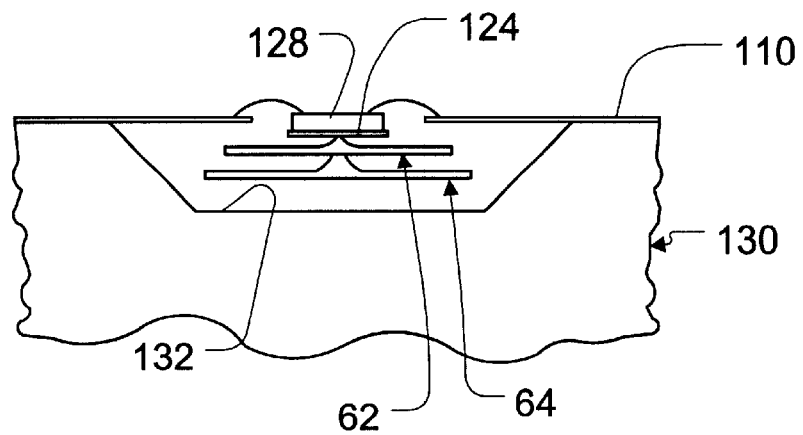
FIG. 12 is a sectional view of a portion of the lead frame of FIG. 11, showing the barrier structure mounted thereto, and the step of wire bonding.

A portion of this lead frame 10 is shown in sectional view of FIG. 12, with the barrier structure 62 and barrier structure 64 being mounted thereto as described above. The die pad 124 has a die 128 epoxied thereto, and the barrier structure 62, 64 are secured to the tie bars 120, 122 on the die pad side of the die 128—die pad 114 assembly. The structure of FIG. 12 is now placed in a wire bonding machine 130 with a cavity 132 sufficiently deep to receive the barrier structures 62, 64. Then, wire bonding is undertaken, after which the barrier structures 58, 60 are added, being secured to the tie bars 120, 122 as described above, on the die side of the die 128—die pad 124 assembly. Then, transfer molding is undertaken to form the plastic package of the device, and the rails 112, 114 and portions of the dam bars 116, 118 are removed as is well known so that the leads 126 of the device are defined and extend from the package.

It is to be noted that spot welding of the protrusions to the tie bars 120, 122 takes place with the dam bars 116, 118, rails 112, 114 and tie bars 120, 122 in place, that is, prior to the removal of the rails 112, 114 and portions on the dam bars 116, 118. Thus, the entire structure is shorted out, and there will not be any voltage imposed on a pin of the device relative to any other pin due to the spot welding operation.

Figure 13:
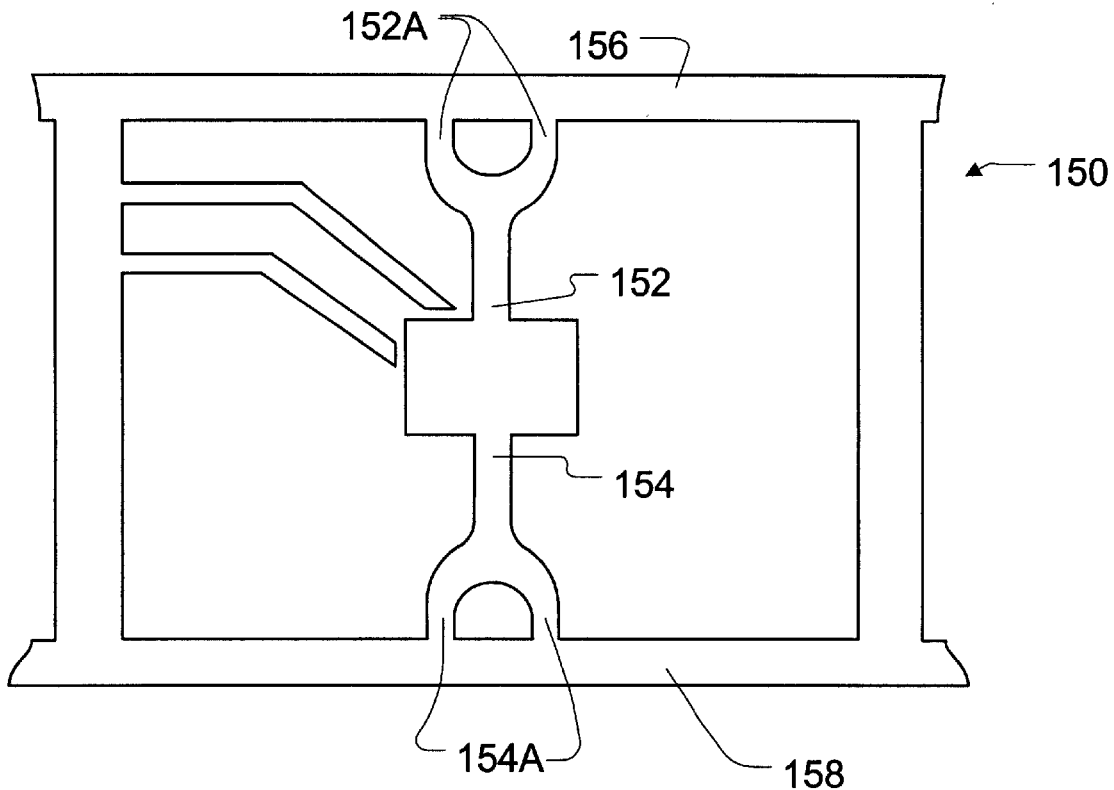
FIG. 13 is a plan view of a portion of an alternative embodiment of lead frame.
Figure 14:
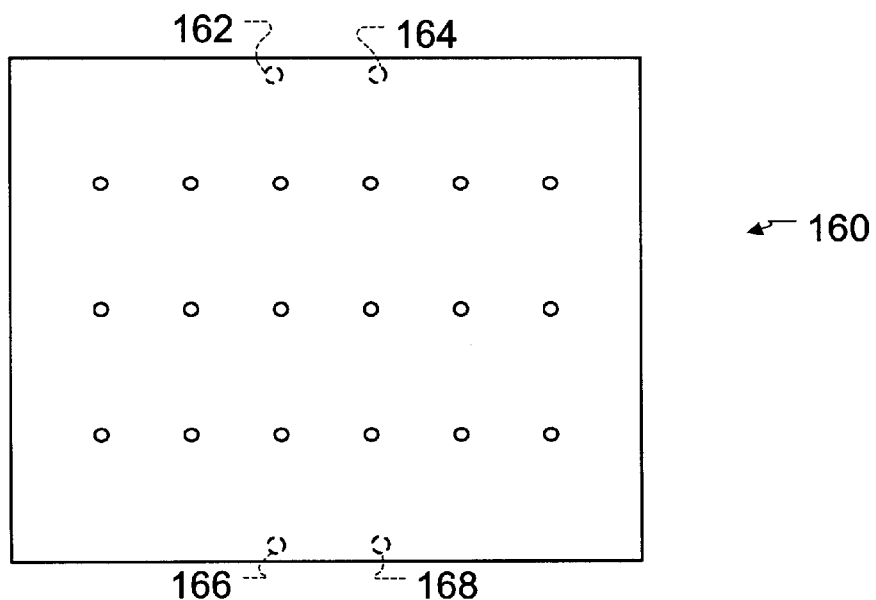
FIG. 14 is a plan view of an alternative embodiment of barrier structure.
Figure 15:
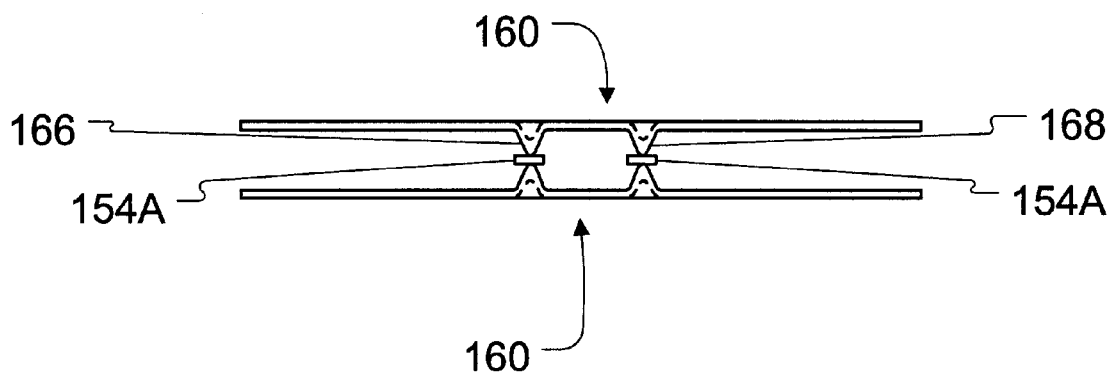
FIG. 15 is a sectional view showing the combination of the structures of FIGS. 13 and 14.

FIG. 13 shows an alternative embodiment of lead frame 150, wherein each tie bar 152, 154 is bifurcated in the respective area 152A, 154A where it extends to connect to a rail 156, 158. In this configuration, each barrier structure 160 has four protrusions 162, 164, 166, 168 stamped therein (FIG. 14), a protrusion being welded to each extended leg of a tie bar. The mounting of the barrier structures 160 to the bifurcated ends 152A, 154A by welding or glue as described above is shown in FIG. 15. This embodiment can be used when increased mounting stability of the barrier structures is desired.

As yet another embodiment, the barrier structures may have protrusions which match up with the four diagonal tie bars of a quad flat pack lead frame configuration.

It will therefore be seen that the present invention provides for highly effective limitation of moisture flow through a package to the critical die-die pad area of a semiconductor device. This resistance to moisture in this critical areas avoids problems of delamination as described above, so that high device reliability is achieved.

The foregoing description of the embodiment of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A semiconductor device comprising:
   a lead frame having a die pad and a tie bar structure extending from the die pad;
   a die an the die pad to form a die-die pad assembly;
   a barrier structure having a barrier body on one side of and spaced from the die-die pad assembly, the barrier structure being secured to the tie bar structure;
   wherein the barrier body generally overlies the die-die pad assembly.

2. A semiconductor device comprising:
   a lead frame having a die pad and a tie bar structure extending from the die pad;
   a die an the die pad to form a die-die pad assembly;
   a barrier structure having a barrier body on one side of and spaced from the die-die pad assembly, the barrier structure being secured to the tie bar structure;
   wherein the barrier body is on the die side of the die-die pad assembly.

3. The semiconductor device of claim 1 wherein the barrier body is on the die pad side of the die-die pad assembly.

4. A barrier structure for resisting moisture flow to a die-die pad assembly of a semiconductor device, wherein the die pad has a tie bar structure extending therefrom, the device comprising a barrier body, the barrier structure being mountable to the tie bar structure so that the barrier body is spaced from the die-die pad assembly, wherein the barrier structure further comprises a protrusion extending from the barrier body for securing the barrier structure to a tie bar structure.

5. The device of claim 4 wherein the projection is a stamped projection.

6. A method of fabricating a semiconductor device comprising:
   providing a lead frame assembly having leads, a die pad, a die on the die pad, and a tie bar structure extending from the die pad;
   providing a first barrier structure secured to the tie bar structure and having a first barrier body positioned on the die pad side of and spaced from the die-die pad assembly;
   wire bonding the die to the leads of the lead frame;
   providing a second barrier structured to the tie bar structure and having a second barrier body on the die side of and spaced from the die-die pad assembly; and providing molding compound around the die-die pad assembly, wire bonding, and first and second barrier structures.

7. The method of claim 6 and further comprising the step of providing that the first and second barrier structures comprise first and second barrier bodies each having a plurality of apertures therethrough.

8. The method of claimed 6 and further comprising the step of providing first and second additional barrier structures secured to the tie bar structure and comprising respective first and second additional barrier bodies positioned respectively on the die and die pad sides of the assembly and the first additional barrier body, the second barrier body positioned generally pad-die pad assembly, the first barrier body generally between the die-die pad between the die-die pad assembly and the second additional barrier body.

9. The device of claim 4 wherein the barrier body has a plurality of apertures therethrough.

10. The semiconductor device of claim 1 and further comprising a second barrier structure having a second barrier body on the other side of and spaced from the die-die pad assembly, the barrier structures each being secured to the tie bar structure.

11. The semiconductor device of claim 1 wherein the barrier body has a plurality of apertures therethrough.

12. A semiconductor device comprising:
   a lead frame having a die pad and a tie bar structure extending from the die pad;
   a die on the die pad to form a die-die pad assembly,
   a barrier structure having a barrier body on one side of and spaced from the die-die pad assembly, the barrier structure being secured to the tie bat structure;
   and further comprising an additional barrier structure having an additional blame body on the one side of the die-die pad assembly, the additional barrier structure being secured to the tie bar structure, the first-mentioned barrier body being positioned generally between the additional barrier body and the die-die pad assembly.

13. The semiconductor device of claim 12 wherein the first and second barrier bodies each define a plurality of apertures therethrough, the apertures defined by the first barrier body being generally non-aligned with the apertures defined by the additional barrier body.

14. The semiconductor device of claim 1 wherein the tie bar structure comprises a plurality of tie bars extending from the die pad, the barrier structure being secured to the plurality of tie bars.

15. A semiconductor device comprising:
- a lead frame having a die pad and a tie bar structure extending from the die pad;
- a die on the die pad to form a die pad assembly;
- a barrier structure having a barrier body on one side of and spaced from the die-die pad assembly, the barrier structure being secure to the tie bar structure;

wherein the barrier structure further comprises a protrusion extending from the barrier body and secured to the tie bar structure.

16. The semiconductor device of claim 1 and further comprising molding compound surrounding the die-die pad assembly and barrier structure.

17. The semiconductor device of claim 12 wherein the first and additional barrier bodies generally overlie the die-die pad assembly.

* * * * *

UNITED STATES PATENT AND TRADEMARK OFFICE
CERTIFICATE OF CORRECTION

PATENT NO. : 6,373,126 B1  
DATED : April 16, 2002  
INVENTOR(S) : Pramod Patel and Richard C. Blish It is certified that error appears in the above-identified patent and that said Letters Patent is hereby corrected as shown below:

<u>Column 5,</u>  
Line 47, "an" should read -- on --.  
Line 56, "an" should read -- on --.

<u>Column 6,</u>  
Line 21, "structured" should read -- structure secured --.  
Line 55, "bat" should read -- bar --.  
Line 57, "blame" should read -- barrier --.

<u>Column 7,</u>  
Line 8, "die pad" should read -- die-die pad --.  
Line 11, "secure" should read -- secured --.

Signed and Sealed this

Fifth Day of November, 2002

Attest:

*Attesting Officer*

JAMES E. ROGAN  
*Director of the United States Patent and Trademark Office*